US010268405B2

United States Patent
Lu et al.

(10) Patent No.: US 10,268,405 B2
(45) Date of Patent: Apr. 23, 2019

(54) DYNAMIC RANK SWITCHING FOR LOW POWER VOLATILE MEMORY

(71) Applicant: MediaTek Inc., Hsinchu (TW)

(72) Inventors: Chia-Lin Lu, Kaohsiung (TW); Min-Hua Chen, Taichung (TW)

(73) Assignee: MediaTek, Inc., Hsinchu (TW)

( * ) Notice: Subject to any disclaimer, the term of this patent is extended or adjusted under 35 U.S.C. 154(b) by 204 days.

(21) Appl. No.: 15/299,702

(22) Filed: Oct. 21, 2016

(65) Prior Publication Data

US 2017/0269861 A1    Sep. 21, 2017

Related U.S. Application Data

(60) Provisional application No. 62/309,484, filed on Mar. 17, 2016.

(51) Int. Cl.
```
G06F 12/06      (2006.01)
G06F 3/06       (2006.01)
G06F 12/02      (2006.01)
G11C 11/406     (2006.01)
G11C 11/4074    (2006.01)
G11C 11/4093    (2006.01)
```
(52) U.S. Cl.
CPC .......... *G06F 3/0625* (2013.01); *G06F 3/0631* (2013.01); *G06F 3/0647* (2013.01); *G06F 3/0656* (2013.01); *G06F 3/0659* (2013.01); *G06F 3/0683* (2013.01); *G06F 12/02* (2013.01); *G06F 12/06* (2013.01); *G11C 11/4074* (2013.01); *G11C 11/4093* (2013.01); *G11C 11/40615* (2013.01); *G11C 11/40618* (2013.01); *G11C 11/40622* (2013.01)

(58) Field of Classification Search
CPC ................................. G06F 12/02; G06F 12/06
See application file for complete search history.

(56) References Cited

U.S. PATENT DOCUMENTS

| | | | |
|---|---|---|---|
| 7,236,416 B2 | 6/2007 | Walker | |
| 2007/0011421 A1* | 1/2007 | Keller, Jr. | G06F 1/3225 711/165 |
| 2011/0131432 A1* | 6/2011 | Berke | G06F 1/3203 713/320 |
| 2013/0212330 A1* | 8/2013 | Brittain | G11C 11/40607 711/106 |

(Continued)

*Primary Examiner* — Hoai V Ho
*Assistant Examiner* — Jay W. Radke
(74) *Attorney, Agent, or Firm* — Tong J. Lee

(57) ABSTRACT

A memory interface includes a buffer for storing requests for accessing a volatile memory, which includes at least two ranks of memory cell of a memory channel The memory interface monitors the requests to access each rank in the buffer. Upon detecting from the requests that a given rank of the at least two ranks is to be idle for a time period exceeding a time threshold, the circuitry signals a controller to command the given rank to enter a self-refresh mode independent of a refresh mode of other ranks. The memory interface is coupled to a processor, which executes an operating system (OS) kernel to prioritize memory allocation from a prioritized rank of the at least two ranks over the given rank, and migrates allocated memory blocks from the given rank to the prioritized rank to increase a probability of idleness of the given rank.

14 Claims, 6 Drawing Sheets

(56) References Cited

U.S. PATENT DOCUMENTS

2014/0129757 A1† 5/2014 Lo
2015/0277543 A1† 10/2015 Chinnakkonda Vidyapoornachary et al.
2016/0306567 A1† 10/2016 Yang \* cited by examiner
† cited by third party

DYNAMIC RANK SWITCHING FOR LOW POWER VOLATILE MEMORY

CROSS-REFERENCE TO RELATED APPLICATIONS

This application claims the benefit of U.S. Provisional Application No. 62/309,484 filed on Mar. 17, 2016.

TECHNICAL FIELD

Embodiments of the invention relate to the management of volatile memory for reducing power consumption.

BACKGROUND

Modern processor systems have placed increasing demands over the bandwidth and capacity on the main memory; as a result, power consumption by the main memory has been growing and accounting for a significant portion of the overall system power usage.

A typical main memory is composed of a volatile memory such as the dynamic random-access memory (DRAM). A volatile memory loses its data quickly when its power supply is removed. A DRAM not only needs a constant power supply to retain data, but its memory cells also need to be periodically refreshed. A DRAM stores each data bit in a capacitor that can be either charged or discharged; these two states are taken to represent the two values (i.e., 0 and 1) of a bit. A charged capacitor slowly leaks over time. Thus, the capacitors are refreshed periodically to replenish the charges such that the stored information can be retained.

Synchronous dynamic random-access memory (SDRAM) is a DRAM device where the operation of its external pin interface is coordinated by an externally supplied clock signal. Some widely adopted SDRAM in modern computing systems include a family of double data rate random-access memory, such as DDR1, DDR2, DDR3 and DDR4.

In a typical scenario, the refresh operations of a DRAM device is managed by a controller, which issues auto-refresh commands at a specified rate to refresh a certain number of rows in each memory chip. Normal memory operations resume after the completion of an auto-refresh. Auto-refresh dissipates substantial power since background power is consumed by the delay locked loop (DLL) and peripheral logic in addition to the power required for refresh. To save background power, a DRAM device has an option to enter a self-refresh mode, where the device internally generates refresh pulses using a built-in timer. In other words, when a device is in the self-refresh mode, all external I/O pins and clocks are disabled, the DLL is turned off, and the device preserves data without any intervention from the memory controller. Some DDR devices support a partial array self-refresh (PASR) option, where the controller can program the device to refresh only a certain portion of the memory.

Modern computing systems utilize the aforementioned power management techniques to reduce the power consumption. However, volatile memory devices still account for a growing percentage of power consumption in these computing systems. Therefore, there is a need to further limit the power consumption of a volatile memory.

SUMMARY

In one embodiment, a system is provided to manage memory power consumption. The system comprises a memory interface coupled to a volatile memory, the volatile memory including at least two ranks of memory cells in a memory channel. The memory interface further comprises a buffer for storing requests for accessing the volatile memory; a controller coupled to the buffer to control access to the volatile memory; and circuitry coupled to controller to: monitor the requests to access each rank in the buffer, and upon detecting from the requests that a given rank of the at least two ranks is to be idle for a given time period exceeding a given time threshold, signal the controller to command the given rank to enter a self-refresh mode independent of a refresh mode of other ranks.

In another embodiment, a system is provided to manage memory power consumption. The system comprises a controller coupled to a volatile memory to control access to the volatile memory, the volatile memory including at least two ranks of memory cells in a memory channel; and a processor coupled to the controller, wherein the processor executes an operating system (OS) kernel operative to: prioritize memory allocation from a prioritized rank of the at least two ranks over a given rank; and migrate allocated memory blocks from the given rank to the prioritized rank to increase a probability of idleness of the given rank.

In yet another embodiment, a method is provided for managing power consumption of a volatile memory that includes at least two ranks of memory cells in a memory channel. The method comprises: monitoring requests, in a buffer, for accessing each rank of the volatile memory; and upon detecting from the requests that a given rank of the at least two ranks is to be idle for a given time period exceeding a given time threshold, commanding the given rank to enter a self-refresh mode independent of a refresh mode of other ranks.

In yet another embodiment, a method is provided for managing memory power consumption. The method comprises: prioritizing memory allocation from a prioritized rank of a volatile memory over a given rank, the volatile memory including at least two ranks of memory cells in a memory channel; and migrating allocated memory blocks from the given rank to the prioritized rank to increase a probability of idleness of the given rank.

According to embodiments described herein, memory power consumption can be improved by hardware and software of a processing system. Memory access requests may be re-ordered based on ranks, and a rank may be designated as a prioritized rank for memory allocation. Further, allocated memory blocks may migrate from other ranks to the prioritized rank to increase a probability of idleness of the other ranks.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide a system and method for managing power consumption of a volatile memory. The volatile memory may be accessed by a processing system via one or more channels. In each channel, the volatile memory further includes at least two ranks. The memory power consumption may be managed by hardware, software, or a combination of both. Each rank may be commanded to enter a self-refresh mode independent of a refresh mode of other ranks. In one embodiment, a memory interface monitors memory access requests in a buffer, and commands a given rank to enter a self-refresh mode upon detecting from the requests that the given rank is to be idle for a time period exceeding a threshold. The memory access requests may be re-ordered in the buffer based on ranks to delay the access to the given rank. In another embodiment, a rank may be designated as a prioritized rank for memory allocation. Allocated memory blocks (e.g., allocated pages) may migrate from other ranks to the prioritized rank to increase a probability of idleness of the other ranks.

As used herein, the term "self-refresh mode" refers to a refresh mode of a volatile memory where the volatile memory internally generates refresh pulses without any intervention from the memory controller. The clock enable signal from the memory controller is disabled (i.e., de-asserted). The self-refresh mode described herein includes the partial array self-refresh (PASR) mode, where the volatile memory refreshes only a certain portion, such as the allocated segments in a given rank or a number of ranks, of the volatile memory. In the PASR mode, memory segments that are unused may be masked from the refresh operations.

Figure 1:
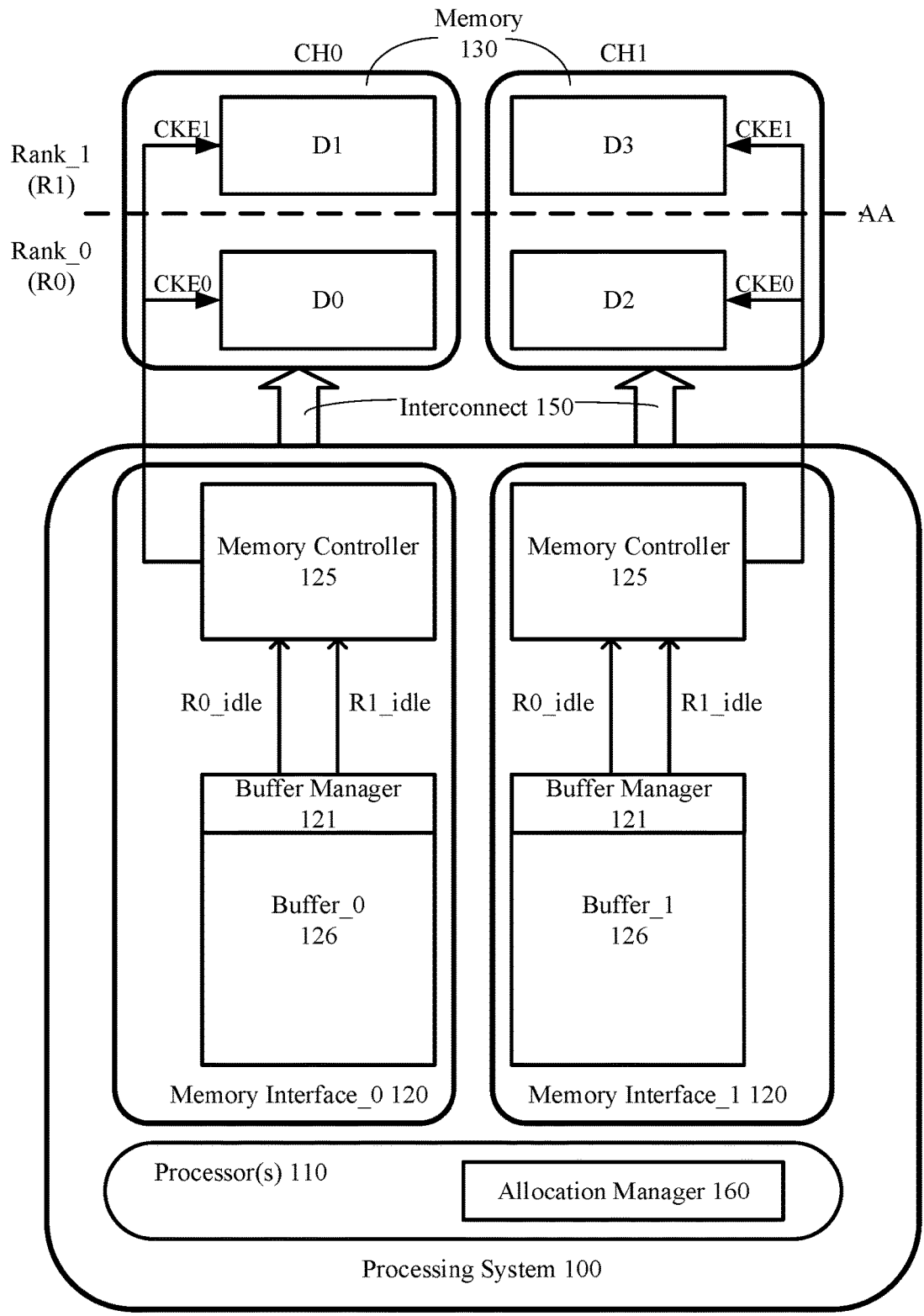
FIG. 1 illustrates a processing system coupled to a volatile memory according to one embodiment.

FIG. 1 illustrates an example of a processing system 100 coupled to a memory 130 according to one embodiment. The memory 130 is a volatile memory, such as a DRAM, SDRAM, DDR, LPDDR, etc. The processing system 100 may include one or more central processing units (CPUs) or other types of processors. In this example, the memory 130 includes two memory channels (e.g., CH0 and CH1), which can be accessed by the processor system 100 through respective memory interfaces 120 and interconnect 150. Each memory channel further includes a number of ranks (e.g., Rank_0 (R0) and Rank_1 (R1), which, for clarity, are separated by a dotted line AA). Each rank includes one or more memory chips or dies (e.g., each of D0, D1, D2 and D3 represents a die). Although specific numbers channel, ranks and dies are shown in FIG. 1, it should be understood that the memory 130 may include any numbers of channels, ranks and dies. Each die in the memory 130 further includes a number of banks, and each bank includes memory cells organized as rows and columns. The memory organization within each die is not shown in FIG. 1 as these details are not germane to the rank-based memory power management to be described below.

In one embodiment, each memory interface 120 includes a memory controller 125. Each memory controller 125 generates clock enable signals (CKE0 and CKE1) to enable or disable the external clocks provided to the corresponding ranks. When the clock enable is asserted (e.g., CKE0 goes high), the corresponding rank (Rank_0) is in the normal state, and stored data in Rank_0 may be accessed by the processing system 100. When the clock enable is de-asserted (e.g., CKE0 goes low), the corresponding rank (Rank_0) is in a power-down state, and stored data in Rank_0 may not be accessed. In both states, memory cells in a rank need to be refreshed from time to time to prevent data loss. Typically, a predetermined time limit is specified for refreshing the memory cells. Each memory cell may be refreshed periodically at a fixed interval within the time limit, or refreshed within the time limit when it is not accessed.

When a rank is in the normal state, its memory cells are typically placed in an auto-refresh mode. In the auto-refresh mode, the memory controller 125 controls the timing of the refresh operations performed on the rows and banks of each rank. When a rank is in a power-down state, the rank may remain in the auto-refresh mode, relying on the memory controller 125 to issue the refresh commands. Alternatively, the rank may enter a self-refresh mode, utilizing its own internal refresh clock and the internal refresh address register to control refresh operations. As mentioned previously, the self-refresh mode is more power efficient than the auto-refresh mode.

In one embodiment, the memory controller 125 may de-assert the clock enable of a given rank and cause the given rank to enter the self-refresh mode when the memory controller 125 is informed that the given rank will not be accessed for read or write for a period of time. In one embodiment, the memory controller 125 may be informed by a buffer manager 121 of the predicted idleness of a rank. The buffer manager 121 may be hardware, firmware, software, or a combination of the above. In one embodiment, each memory interface 120 includes circuitry that serves as the buffer manager 121 for managing memory access requests pending in a corresponding one of the buffers 126 (e.g., Buffer_0 and Buffer_1). The requests in the buffer 126 may be executed out of order.

The buffer manager 121 constantly monitors memory access requests in its buffer 126. If the buffer manager 121 detects that any of the ranks is not going to be accessed for a time period exceeding a threshold, the buffer manager 121 asserts an idle signal for that rank (e.g., R0_idle or R1_idle). If the buffer manager 121 detects that any of the ranks is going to be accessed within a given period of time, the buffer manager 121 de-asserts the idle signal for that rank. The idle signal is sent to the memory controller 125. The memory controller 125 de-asserts the clock enable signal (i.e., CKE)

of a rank when the idle signal for that rank is asserted. The memory controller 125 asserts the clock enable signal of a rank when the idle signal for that rank is de-asserted.

In one embodiment, the buffer manager 121 may group the memory access requests in its buffer 126 by ranks, and re-order the requests to delay access to one or more given ranks (e.g., ranks other than Rank_0) so that these given ranks may be idle for an extended time period.

Figure 2:
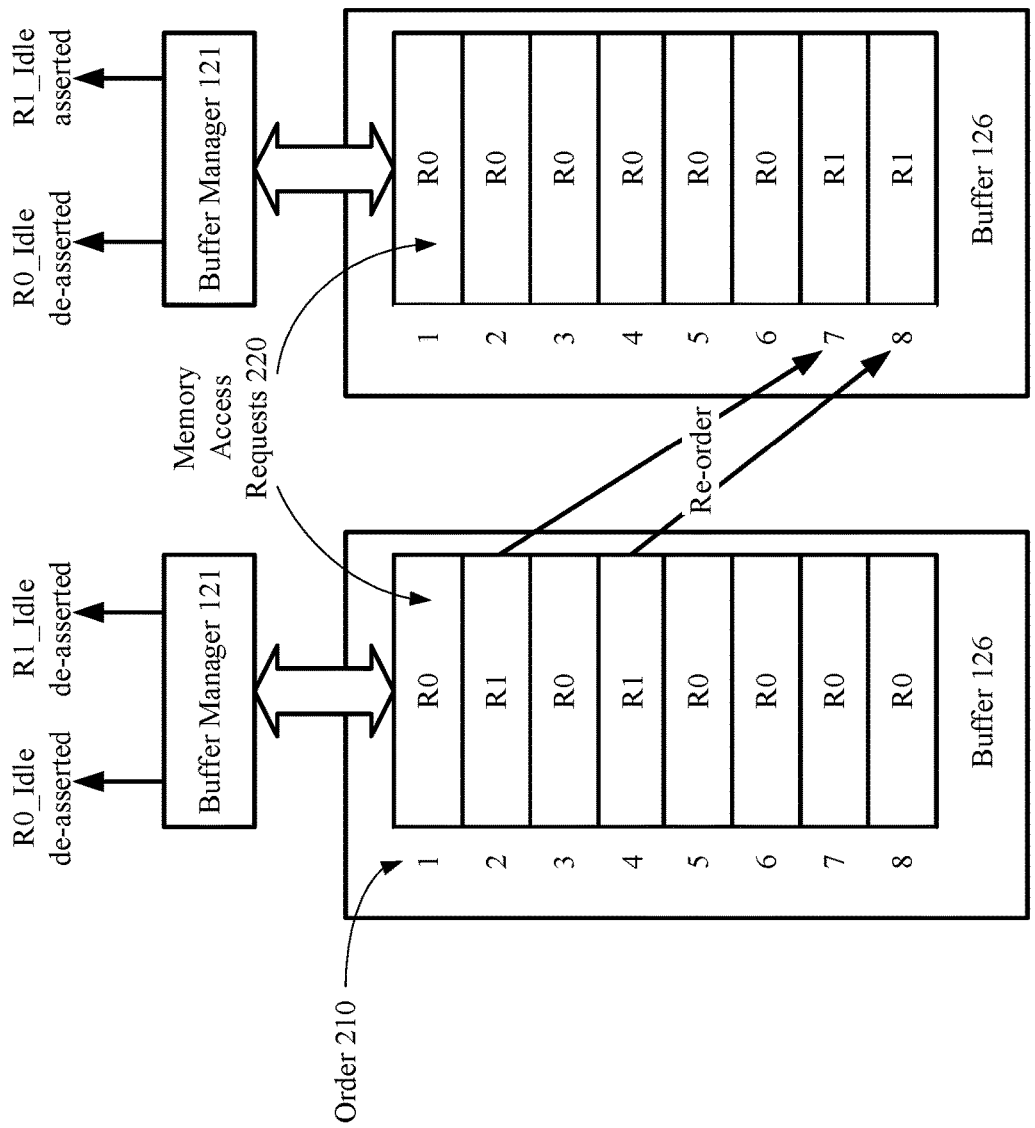
FIG. 2 illustrates an example of grouping and re-ordering memory access requests according to one embodiment.

FIG. 2 illustrates an example of grouping and re-ordering the memory access requests in the buffer 126 of one memory channel according to one embodiment. The buffer 126 is shown to store eight memory access requests 220 as an example. It should be understood that the buffer 126 may store a different number of memory access requests than what is shown, and that the same re-ordering technique may be applied to all of the memory channels.

For simplicity, each memory access request 220 in FIG. 2 is identified by the rank to be accessed. The description hereinafter assumes that Rank_0 is used to store system software and system information. Non-system data, such as user applications, can be stored in any rank of the memory 130 (FIG. 1). The memory access requests 220 are queued in the buffer 126 and are to be executed according to an order 210 (e.g., from the top to the bottom of the buffer 126 as shown). In the example of FIG. 2, the buffer manager 121 monitors and re-orders the requests in the buffer 126 such that access to Rank_0 is prioritized over Rank_1. As a result, Rank_1 access requests can be grouped together and delayed for execution to allow Rank_1 to stay idle for an extended period of time. A system is typically more tolerable to delays in Rank_1 access, as non-system data (e.g., user applications) is typically insensitive to limited latency.

More specifically in FIG. 2, at time T=T1, both Rank_0 and Rank_1 are in normal mode and both R0_idle and R1_idle are de-asserted. At this point, the buffer manager 121 detects that two requests for accessing Rank_1 are in the buffer 126 and the two requests may be pushed to the bottom of the buffer 126. As a result at time T=T2, six consecutive commands for accessing Rank_0 are ahead of the two commands for accessing Rank_1, which indicates that Rank_1 will not be accessed for at least the duration (Td) of executing the six consecutive requests for accessing Rank_1. In some embodiments, the buffer manager 121 may keep delaying the access to Rank_1 until a time limit for accessing the requested data in Rank_1 is reached.

Referring also to FIG. 1, in one embodiment, if the duration Td is greater than a predetermined threshold, the buffer manager 121 asserts R1_idle. In response, the memory controller 125 of the corresponding channel (e.g., CH0) de-asserts CKE1 to place D1 into the self-refresh mode. The re-ordering operations performed by the buffer manager 121 is dynamic; that is, the re-ordering may be performed during system operation without incurring system downtime. It is understood that the dynamic rank switching operations of FIG. 2 may be applied to a memory that includes two or more ranks of memory cells, to allow each rank (other than Rank_0 where system software and information are stored) to be dynamically switched on (i.e., the normal state) or switched off (i.e., the power-down state and self-refresh mode). The granularity of such rank switching can be as small as the time it takes to execute a predetermined number of requests in the buffer 126.

In one embodiment, the processing system 100 may further includes an allocation manager 160 to manage memory allocation. The allocation manager 160 may be a software module as part of the OS kernel executing on the processing system 100, and may alternatively be hardware or firmware. The allocation manager 160 allocates one or more pages (e.g., 4 Kbytes memory blocks), in response to an allocation request, from a free list that identifies the pages available for allocation. The free list may include the pages from all ranks. During operation of the processing system 100, allocated pages of different ranks may be freed for reuse in a random pattern, resulting in fragmented usage as illustrated in the example of FIG. 3A.

Figure 3A:
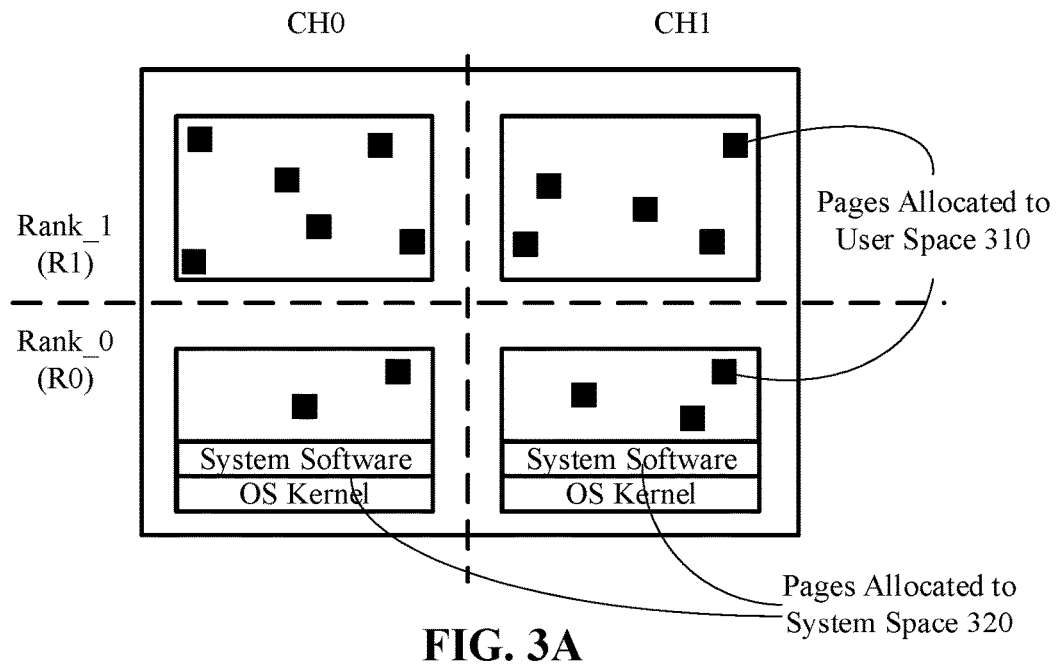
FIG. 3A illustrates an example of memory fragmentation during operation.
Figure 3B:
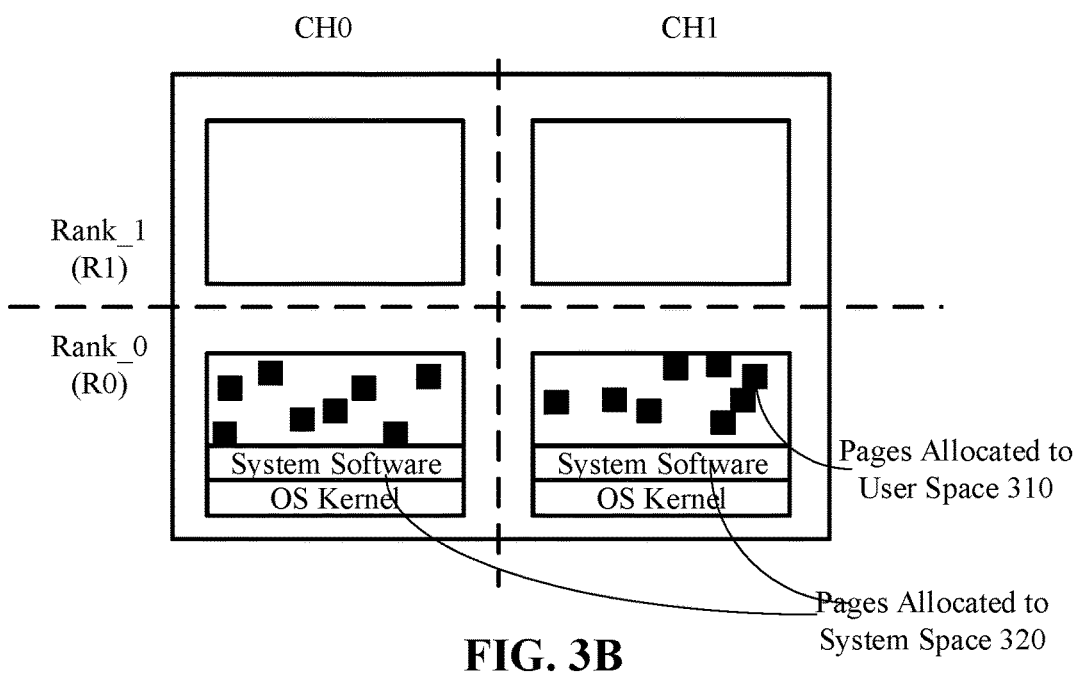
FIG. 3B illustrates an example of a result of migrating allocated pages from one rank to another rank.

FIG. 3A illustrates an example of memory fragmentation during operation. The dark squares in the memory 130 represents memory blocks (e.g., pages) that are allocated to the user space 310. In one embodiment, contiguous pages in Rank_0 are allocated to the system space 320 for storing OS kernel, system software such as modem, connectivity software modules. The user space pages are scattered in both ranks. The allocation manager 160 may migrate the allocated pages from Rank_1 to Rank_0, as shown in the example of FIG. 3B. When the memory 130 is under light usage, Rank_1 may contain none or very few allocated pages. The reduction of the allocated pages in Rank_1 means that Rank_1 may be accessed less frequently for read and write; thus it is more likely for Rank_1 to be idle.

Figure 4:
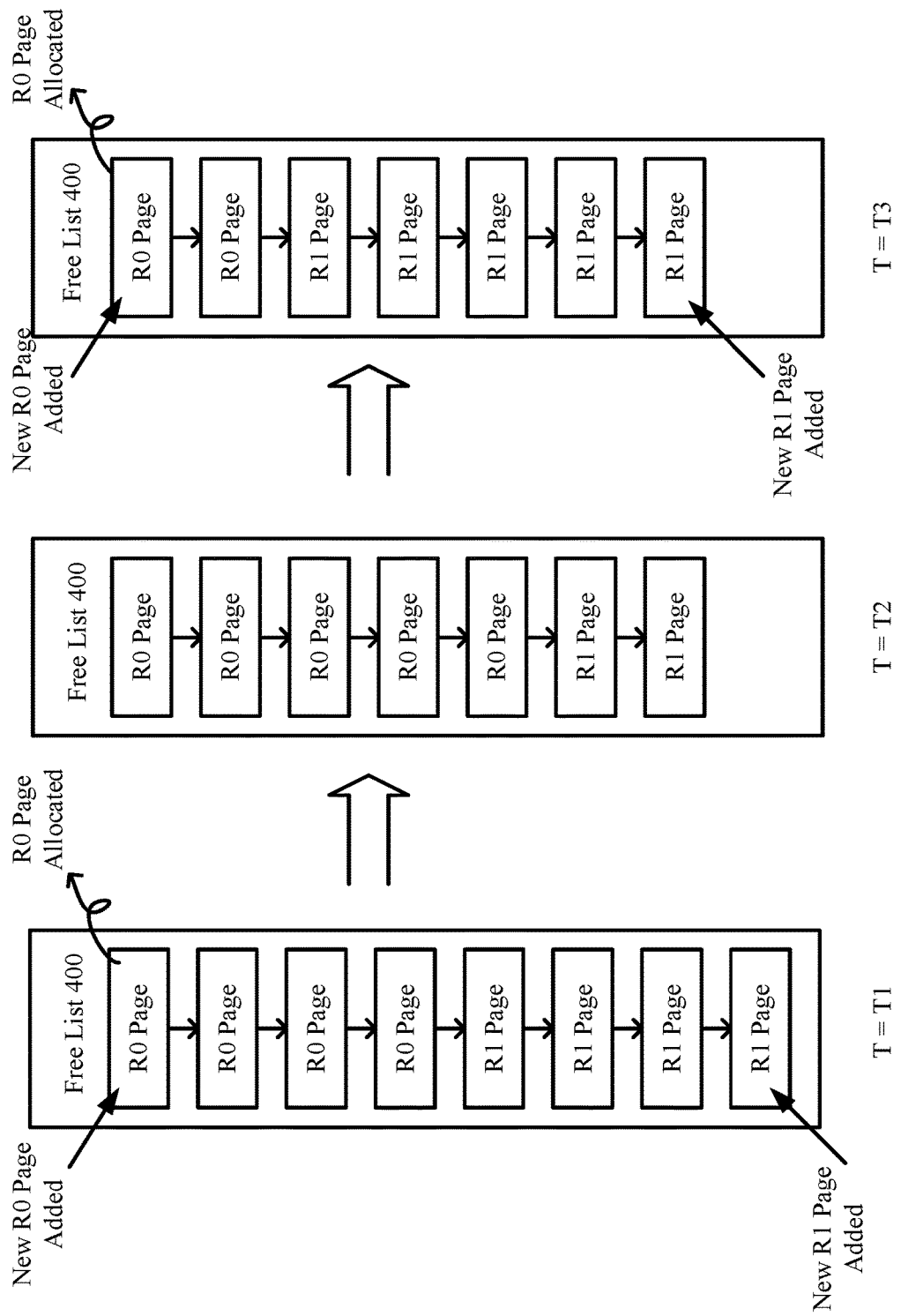
FIG. 4 illustrates an example of memory allocation performed by an allocation manager for two ranks according to one embodiment.

FIG. 4 illustrates an example of operations that may be performed by the allocation manager 160 according to one embodiment. This embodiment shows a free list 400 including pages of two ranks: Rank_0 and Rank_1. Rank_0 is the rank where the system software and information are stored as shown in the examples of FIG. 3A and FIG. 3B. In this two-rank example, the allocation manager 160 is to increase the probability of idleness of Rank_1 by reducing the number of allocated pages in Rank_1; that is, by giving the pages of Rank_0 a higher priority for allocation over Rank_1. In this example, Rank_0 may be designated as a prioritized rank.

In one embodiment, the allocation manager 160 may sort the available pages in the free list 400 such that the prioritized rank is on top of the free list 400 for allocation; that is, the prioritized rank (e.g., Rank_0) has priority for allocation over the other rank (e.g., Rank_1).

In the example of the free list 400, pages of Rank_0 (i.e., R0 pages) are pooled or grouped together, and pages of Rank_1 (i.e., R1 pages) are pooled or grouped together. R0 pages are given a higher priority for allocation over R1 pages. In one embodiment, R1 pages are allocated only when R0 pages are exhausted in the free list 400.

In the example of FIG. 4, the free list 400 is a linked list; however, a different data structure may be used as the free list 400. In the linked list as shown, R0 pages may be placed at the head of the list and R1 pages may be placed at the tail of the list. The allocation proceeds from the head to the tail of the list; thus, R1 pages are allocated only when R0 pages are exhausted in the free list 400. The leftmost diagram of FIG. 4 shows the free list 400 at time T=T1 after the initial grouping of the pages.

During operation, some of the allocated pages may be freed and returned to the free list 400. A freed R0 page is returned to the pool of available R0 pages; in the linked list example of FIG. 4, a freed R0 page may be returned to the head of the free list 400. A freed R1 page is returned to the pool of available R1 pages; in the linked list example of FIG. 4, a freed R1 page may be returned to the tail of the free list 400. During operation at time T=T2, there may be a significant number of allocated R1 pages even though a significant number of R0 pages are available for allocation. This may be caused by memory fragmentation as shown in FIG. 3A, where allocated user space pages 310 are scattered across different ranks of the memory 130. In one embodiment, some or all of the allocated R1 pages may be relocated (e.g., migrated) to Rank_0 to reduce the Rank_1 memory usage. As a result of the migration, more R1 pages are freed, and the probability of Rank_1 being idle is increased. The rightmost diagram of FIG. 4 shows the free list 400 at time T=T3 after page migration from Rank_1 to Rank_0.

Figure 5:
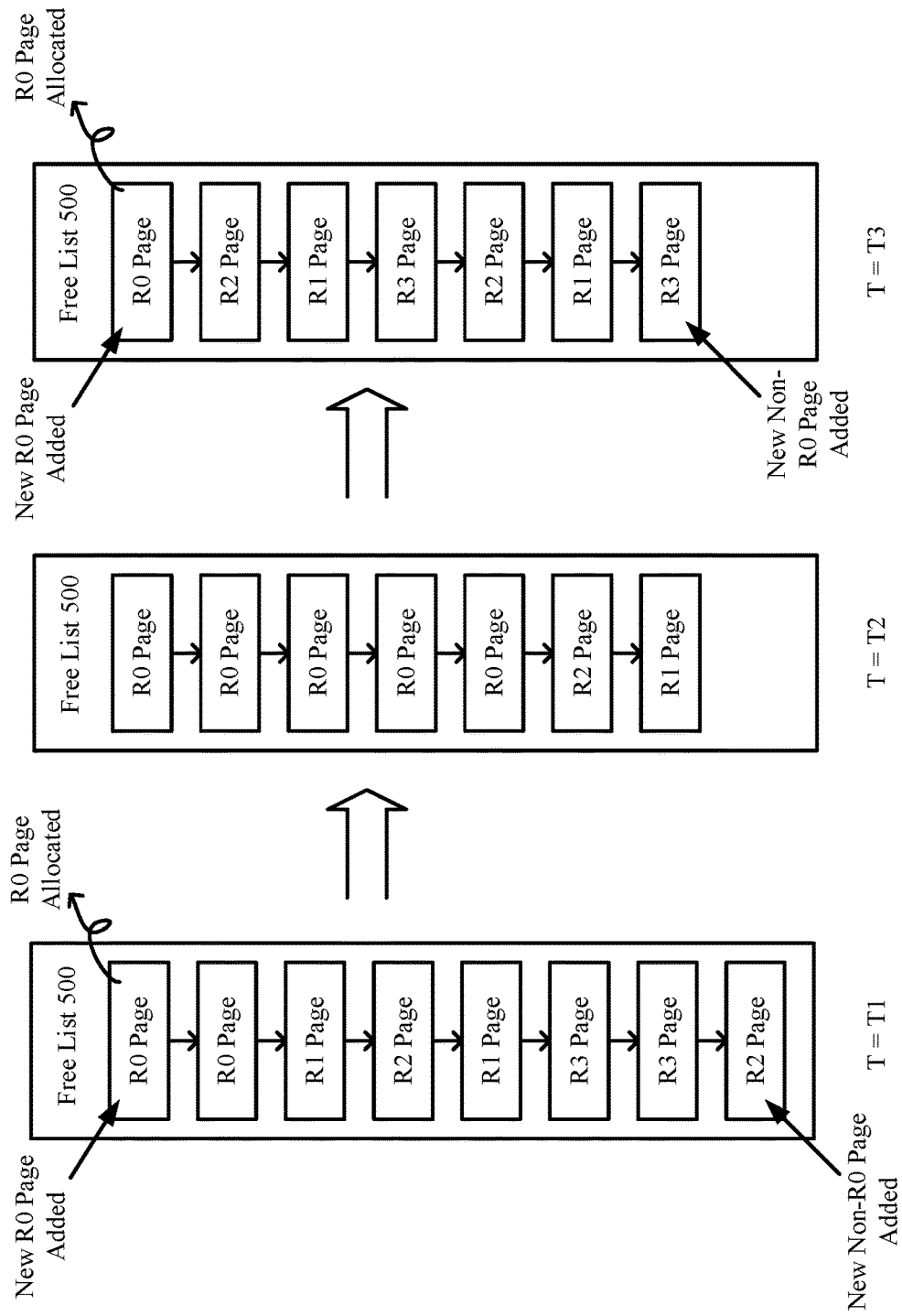
FIG. 5 illustrates an example of memory allocation performed by an allocation manager for multiple ranks according to one embodiment.

FIG. 5 illustrates an example of operations that may be performed by the allocation manager 160 according to another embodiment. This embodiment shows a free list 500 including pages of four ranks: Rank_0, Rank_1, Rank_2 and Rank_3. Rank_0 is the rank where the system software and information are stored as shown in the examples of FIG. 3A and FIG. 3B. In this four-rank example, the allocation manager 160 is to increase the probability of idleness of ranks other than Rank_0 (e.g., Rank_1, Rank_2 and Rank_3) by reducing the number of allocated pages in these three ranks; that is, by giving the pages of Rank_0 a higher priority for allocation over the other ranks. In this example, Rank_0 may be designated as a prioritized rank.

In one embodiment, the allocation manager 160 may sort the available pages in the free list 500 such that the prioritized rank is on top of the free list 500 for allocation; that is, the prioritized rank (e.g., Rank_0) has priority for allocation over other ranks (e.g., Rank_1, Rank_2 and Rank_3).

In the example of the free list 500, R0 pages are pooled or grouped together, and pages of the other ranks (i.e., R1 pages, R2 pages and R3 pages) are pooled or grouped together. R0 pages are given a higher priority for allocation over the other pages (a.k.a. non-R0 pages). In one embodiment, the non-R0 pages are allocated only when R0 pages are exhausted in the free list 500.

Similar to the free list 400 of FIG. 4, the free list 500 is a linked list; however, a different data structure may be used as the free list 500. In the linked list as shown, R0 pages may be placed at the head of the list and non-R0 pages may be placed at the tail of the list. The allocation proceeds from the head to the tail of the list; thus, non-R0 pages are allocated only when R0 pages are exhausted in the free list 500. The leftmost diagram of FIG. 5 shows the free list 500 at time T=T1 after the initial grouping of the pages.

In the linked list example of FIG. 5, a freed non-R0 page may be returned to the tail of the free list 500. During operation at time T=T2, there may be a significant number of allocated non-R0 pages even though a significant number of R0 pages are available for allocation as described before. In one embodiment, some or all of the allocated non-R0 pages may be relocated (e.g., migrated) to Rank_0 to reduce the memory usage in the other ranks. As a result of the migration, more non R0 pages are freed, and the probability of the other ranks being idle is increased. The rightmost diagram of FIG. 5 shows the free list 500 at time T=T3 after page migration from the other ranks to Rank_0.

In one embodiment, a given page may be migrated by copying its content to another page, and then removing all references to that given page. The migration described in connection with FIG. 4 and FIG. 5 may take place in the background, at a low-traffic time (e.g., the midnight), in response to a timer that expires periodically, in response to a user command (e.g., via command-line interface or graphical user interface such as an icon), and/or in response to a signal from hardware (e.g., the memory interface 120) indicating that a given rank has not entered the self-refresh mode for a time period exceeding a predetermined time threshold. It is understood that the operations of FIG. 4 and FIG. 5 may be applied to a memory that includes any number of ranks that is at least two. In one embodiment, the reduction in allocation of non-R0 pages can be seen from a reduction in the requests in the buffer 126 for accessing the non-Rank_0 memory.

Figure 6:
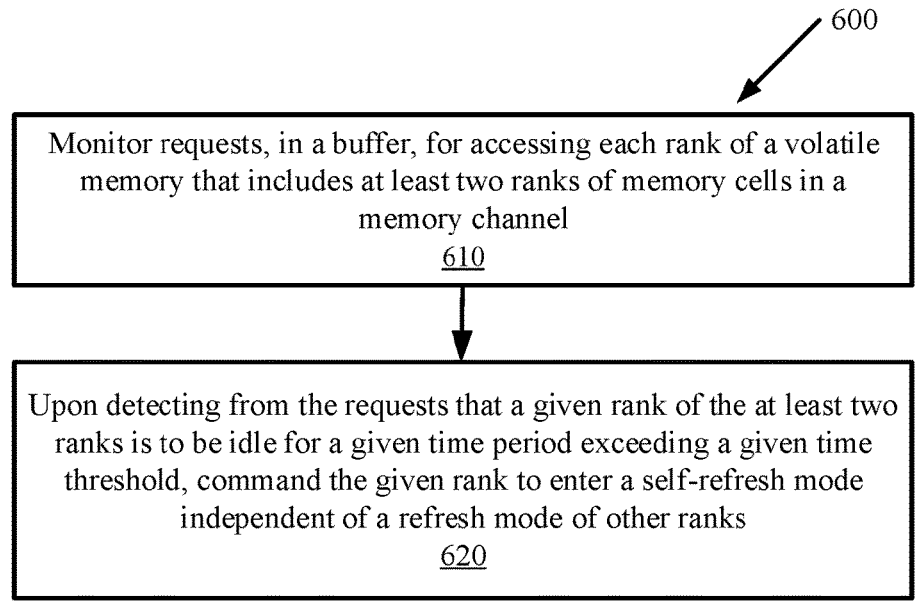
FIG. 6 is a flow diagram illustrating a method for managing memory power consumption according to one embodiment.

FIG. 6 is a flow diagram illustrating a method 600 for managing power consumption of a volatile memory according to one embodiment. In one embodiment, the method 600 may be performed by a processing system, such as the processing system 100 of FIG. 1; more specifically, the method 600 may be performed by each of the memory interfaces 120 for accessing a volatile memory that includes at least two ranks of memory cells in a memory channel of one or more memory channels. The method 600 begins with the processing system monitoring requests, in a buffer, for accessing each rank of the volatile memory (step 610). Upon detecting from the requests that a given rank of the at least two ranks is to be idle for a given time period exceeding a given time threshold, the processing system commands the given rank to enter a self-refresh mode independent of a refresh mode of other ranks (step 620). In one embodiment, the requests in the buffer may be grouped by ranks, and re-ordered to delay access to the given rank.

Figure 7:
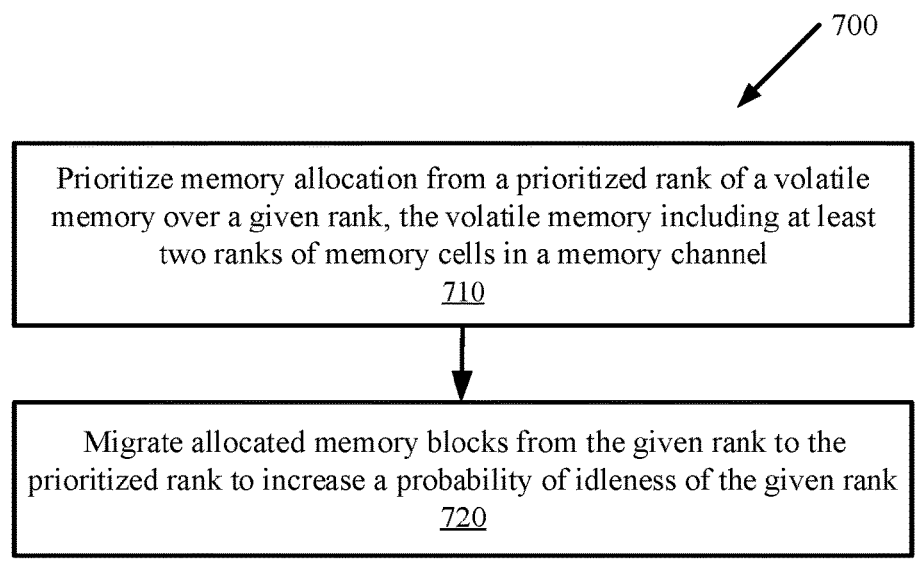
FIG. 7 is a flow diagram illustrating a method for managing memory power consumption according to another embodiment.

FIG. 7 is a flow diagram illustrating a method 700 for managing power consumption of a volatile memory according to one embodiment. In one embodiment, the method 700 may be performed by a processing system, such as the processing system 100 of FIG. 1; more specifically, the method 700 may be performed by a processor system executing an OS kernel for allocating memory blocks in a volatile memory that includes at least two ranks of memory cells in a memory channel of one or more memory channels. The method 700 begins with the OS kernel prioritizing memory allocation from a prioritized rank of the volatile memory over a given rank (step 710). The OS kernel further migrates allocated memory blocks from the given rank to the prioritized rank to increase a probability of idleness of the given rank (step 720).

In alternative embodiments, the methods 600 and 700 may be performed by hardware (e.g., circuitry, dedicated logic, programmable logic, microcode, etc.), software (e.g., instructions run on a processing device), firmware, or a combination thereof.

The operations of the flow diagrams of FIGS. 6 and 7 have been described with reference to the exemplary embodiment of FIG. 1. However, it should be understood that the operations of the flow diagrams of FIGS. 6 and 7 can be performed by embodiments of the invention other than the embodiment discussed with reference to FIG. 1, and the embodiment discussed with reference to FIG. 1 can perform operations different than those discussed with reference to the flow diagrams. While the flow diagrams of FIGS. 6 and 7 show a particular order of operations performed by certain embodiments of the invention, it should be understood that such order is exemplary (e.g., alternative embodiments may perform the operations in a different order, combine certain operations, overlap certain operations, etc.).

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A system operative to manage memory power consumption, comprising:
a memory interface coupled to a volatile memory, the volatile memory including at least two ranks of memory cells in a memory channel, the memory interface further comprising:
a buffer for storing requests for accessing the volatile memory;
a controller coupled to the buffer to control access to the volatile memory; and
circuitry coupled to the controller to:
monitor the requests to access each rank in the buffer,
re-order the requests in the buffer to delay access to a given rank of the at least two ranks; and
upon detecting that the delayed access to the given rank causes the given rank to be idle for a given time period exceeding a given time threshold, signal the controller to command the given rank to enter a self-refresh mode independent of a refresh mode of other ranks.

2. The system of claim 1, wherein the memory interface is further operative to:
group the requests in the buffer by ranks before re-ordering the requests in the buffer to delay access to the given rank.

3. The system of claim 1, further comprising:
a processor coupled to the memory interface, wherein the processor executes an operating system (OS) kernel to prioritize memory allocation from a prioritized rank of the at least two ranks over the given rank.

4. The system of claim 3, wherein the processor is further operative to:
migrate allocated memory blocks from the given rank to the prioritized rank to increase a probability of idleness of the given rank.

5. The system of claim 4, wherein the processor is further operative to migrate the allocated memory blocks when detecting that the given rank has not entered the self-refresh mode for a time period exceeding a threshold.

6. The system of claim 4, wherein the processor is operative to migrate the allocated memory blocks in response to a user command or a timer that expires periodically.

7. The system of claim 1, wherein the self-refresh mode includes a partial array self-refresh mode, in which a portion of memory pages in the given rank are self-refreshed.

8. A method for managing power consumption of a volatile memory that includes at least two ranks of memory cells in a memory channel, the method comprising:
monitoring requests, in a buffer, for accessing each rank of the volatile memory;
re-ordering the requests in the buffer to delay access to a given rank of the at least two ranks; and
upon detecting that the delayed access to the given rank causes the given rank to be idle for a given time period exceeding a given time threshold, commanding the given rank to enter a self-refresh mode independent of a refresh mode of other ranks.

9. The method of claim 8, further comprising:
grouping the requests in the buffer by ranks before re-ordering the requests in the buffer to delay access to the given rank.

10. The method of claim 8, further comprising:
prioritizing memory allocation from a prioritized rank of the at least two ranks over the given rank.

11. The method of claim 10, further comprising:
migrating allocated memory blocks from the given rank to the prioritized rank to increase a probability of idleness of the given rank.

12. The method of claim 11, wherein the allocated memory blocks are migrated when the given rank has not entered the self-refresh mode for a time period exceeding a threshold.

13. The method of claim 11, wherein the allocated memory blocks are migrated in response to a user command or a timer that expires periodically.

14. The method of claim 9, wherein the self-refresh mode includes a partial array self-refresh mode, in which a portion of memory pages in the given rank are self-refreshed.

* * * * *